United States Patent [19]
Yamada

[11] Patent Number: 4,899,126
[45] Date of Patent: Feb. 6, 1990

[54] THICK FILM RESISTOR TYPE PRINTED CIRCUIT BOARD
[75] Inventor: Takeharu Yamada, Nara, Japan
[73] Assignee: Sharp Kabushiki Kaisha, Osaka, Japan
[21] Appl. No.: 293,416
[22] Filed: Jan. 4, 1989
[30] Foreign Application Priority Data
  Mar. 7, 1988 [JP] Japan .............. 63-30869[U]
[51] Int. Cl.⁴ .......................................... H01C 1/012
[52] U.S. Cl. ...................................... 338/309; 29/621; 219/541; 338/307; 338/327
[58] Field of Search .............. 338/309, 307, 308, 322, 338/327, 328, 332; 29/610.1, 621; 361/305, 311; 219/541

[56] References Cited
U.S. PATENT DOCUMENTS

| 2,585,752 | 2/1952  | Dorst ................. 361/305 X |
| 2,758,267 | 8/1956  | Short ................. 361/305 X |
| 3,621,442 | 11/1971 | Racht et al. ............... 338/309 |
| 3,649,645 | 3/1972  | Waits ................... 338/309 |
| 3,775,725 | 11/1973 | Endo ................... 338/254 X |
| 3,909,680 | 9/1975  | Tsunashima ............. 338/334 X |
| 4,654,510 | 3/1987  | Umega et al. ........... 338/327 X |
| 4,695,504 | 9/1987  | Watanabe et al. ........ 338/309 X |
| 4,816,615 | 3/1989  | Prabhu et al. ............ 174/68.5 |

Primary Examiner—C. L. Albritton
Attorney, Agent, or Firm—Birch, Stewart, Kolasch & Birch

[57] ABSTRACT

A thick film resistor type printed circuit board including an insulating substrate, a plurality of pairs of terminal electrode layers made of silver and formed on the insulating substrate, a plurality of resistor layers formed on the terminal electrode layers so as to connect the pairs of the terminal electrode layers, respectively, a plurality of wiring conductive layers made of copper and connected to predetermined ones of the terminal electrode layers so as to coat the predetermined ones of the terminal electrode layers and a protective layer for covering at least a portion of the insulating substrate, in which portion the terminal electrode layers and the resistor layers are formed.

6 Claims, 1 Drawing Sheet

THICK FILM RESISTOR TYPE PRINTED CIRCUIT BOARD

BACKGROUND OF THE INVENTION

The present invention relates to a thick film resistor type printed circuit board, which is used for a hybrid integrated circuit requiring high reliability.

FIGS. 1a to 1d show one example of manufacturing steps of a known thick film resistor type printed circuit board. As shown in FIG. 1a, a plurality of wiring conductive layers 14 made of copper are initially formed on an insulating substrate 1 by chemical etching of a copper foil, by printing and curing of copper paste, etc. Then, as shown in FIG. 1b, silver paste is printed and cured so as to partially overlap the wiring conductive layers 14 such that a plurality of pairs of terminal electrode layers 12 and 12' are formed. Each pair of the terminal electrode layers 12 and 12' are so provided as to confront each other. Subsequently, as shown in FIG. 1c, a plurality of resistor layers 13 each connecting each pair of the terminal electrode layers 12 and 12' is formed by printing, drying and then, curing at about 100° to 200° C. resistor paste made of carbon resin, etc. Thereafter, as shown in FIG. 1d, cuts 5 are formed on the resistor layers 13 by laser beams, etc. so as to adjust resistance values of the resistor layers 13. Furthermore, resinous paste is printed at other portions of the insulating substrate 1 than a joint portion to be connected to an external circuit of the wiring conductive layers 14 and is cured through heating, irradiation of ultraviolet rays thereto, etc. so as to form a protective layer 6.

As described above, in the known thick film resistor type printed circuit board, the terminal electrode layers 12 and 12', acting as a resistor, are made of silver. Thus, in the case where a potential difference is produced between the terminal electrode layers 12 and 12' during actual use of the known thick film resistor type printed circuit board, a phenomenon of so-called silver migration takes place in which silver ions ($Ag^+$) in the terminal electrode layers 12 and 12' migrate in the presence of moisture acting as an electrolyte such that silver is deposited on one of the terminal electrode layers 12 and 12' having a lower electric potential, thereby resulting in a short-circuit between the terminal electrode layers 12 and 12' in the worse case.

SUMMARY OF THE INVENTION

Accordingly, an essential object of the present invention is to provide with a view to eliminating the disadvantages inherent in conventional thick film resistor type printed circuit boards, a thick film resistor type printed circuit board in which silver migration is restricted such that reliability of the thick film resistor type printed circuit board is improved.

In order to accomplish this object of the present invention, a thick film resistor type printed circuit board embodying the present invention comprises an insulating substrate, a plurality of pairs of terminal electrode layers made of silver, which are formed on the insulating substrate, a plurality of resistor layers which are formed on the terminal electrode layers so as to connect the pairs of the terminal electrode layers, respectively, a plurality of wiring conductive layers made of copper, which are, respectively, connected to predetermined ones of the terminal electrode layers so as to coat said terminal electrode layers and a protective layer for covering at least a portion of the insulating substrate, in which portion the terminal electrode layers and the resistor layers are formed.

In the thick film resistor type printed circuit board of the present invention, since the silver terminal electrode layers acting as terminals of the resistor layers are coated with the copper wiring conductive layers which restrict occurrence of ion migration, migration of silver ions is restricted.

BRIEF DESCRIPTION OF THE DRAWINGS

This object and other features of the present invention will become apparent from the following description taken in conjunction with the preferred embodiment thereof in reference to the accompanying drawings, in which.

Before the description of the present invention proceeds, it is to be noted that like parts are designated by like reference numerals throughout the several views of the accompanying drawings.

DETAILED DESCRIPTION OF THE INVENTION

Figure 1A:
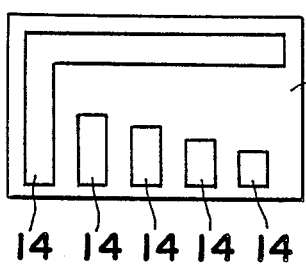
FIGS. 1a to 1d are views showing one example of manufacturing steps of a prior art thick film resistor type printed circuit board (already referred to)
Figure 1B:
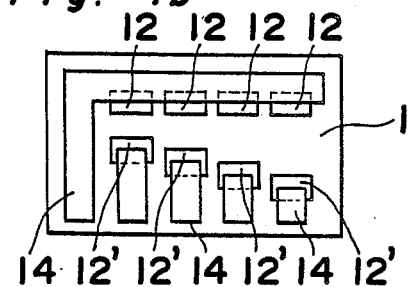
Figure 1C:
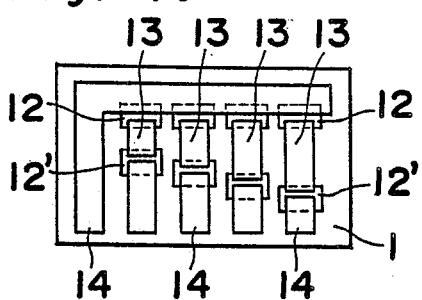
Figure 1D:
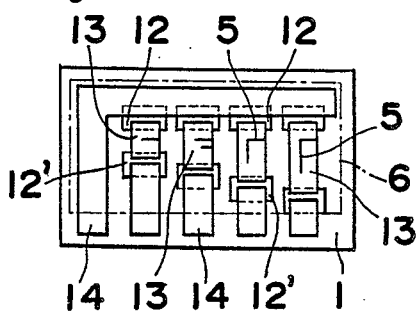
Figure 2A:
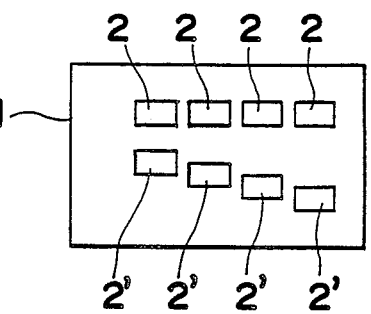
FIGS. 2a to 2d are views showing one example of manufacturing steps of a thick film resistor type printed circuit board according to the present invention.
Figure 2B:
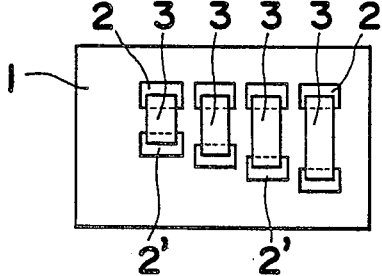

Referring now to the drawings, there is seen in FIGS. 2a to 2d, one example of the manufacturing steps of a thick film resistor type printed circuit board 7 according to the present invention. As shown in FIG. 2a, silver conductive paste having a predetermined shape is initially printed, dried and then cured through heating on an insulating substrate 1 so as to form a plurality of pairs of silver terminal electrode layers 2 and 2' such that each pair of the terminal electrode layers 2 and 2' confront each other. If the conductive paste is made of resin, heating of the conductive paste for curing is performed at 100° to 300° C. Meanwhile, if the conductive paste is made of glass, heating of the conductive paste for curing is performed at 500° to 1,000° C. Then, as shown in FIG. 2b, resistor paste is printed, dried and then cured through heating the terminal electrode layers 2 and 2' so as to form a plurality of resistor layers 3 for connecting the pairs of the terminal electrode layers 2 and 2', respectively. If the resistor paste is made of resin, heating of the resistor paste for curing is performed at 100° to 300° C. Meanwhile, if the resistor paste is made of glass, heating of the resistor paste for curing is performed at 500° to 1,000° C.

Figure 2C:
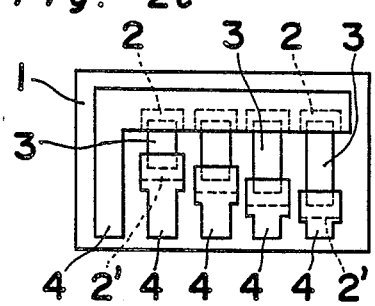
Figure 2D:
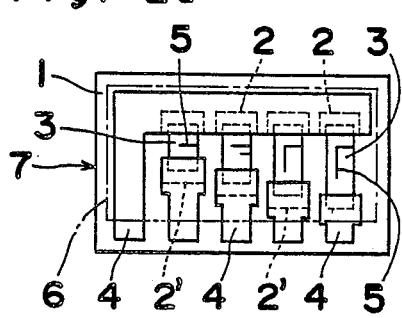

Subsequently, as shown in FIG. 2c, copper conductive paste is printed, dried and then cured through its heating so as to form a plurality of copper wiring conductive layers 4 such that the wiring conductive layers 4 overlap predetermined ones of the terminal electrode layers 2 and 2' and the resistor layers 3. At this time, the conductive paste is printed so as to completely coat exposed portions of the terminal electrode layers 2 and 2'. If the conductive paste is made of resin, heating of the conductive paste for curing is performed at 100° to 300° C. Meanwhile, if the conductive paste is made of glass, heating of the conductive paste for curing is performed at 500° to 1,000° C. Finally, as shown in FIG. 2d, cuts 5 are formed on the resistor layers 3 by YAG laser beams, etc. so as to adjust resistance values of the resistor layers 3. Then, coating material of epoxy resin is printed at portions of the insulating substrate 1 other than a joint portion to be connected to an external circuit of the wiring conductive layers 4 so as to cover at least a whole area in which the terminal electrode layers 2 and 2' and the resistor layers 3 are formed. Subsequently, the coating material of epoxy resin is cured through heating, irradiation of ultraviolet rays thereto, etc. so as to form a protective layer 6. This curing is performed at 100° to 300° C. in the case of heating and at 300 mJ/cm$^2$ or more in the case of irradiation of ultraviolet rays. Thus, the thick film resistor type printed circuit board 7 is obtained.

The thick film resistor type printed circuit board 7 of the present invention is manufactured by the above described steps. In the thick film resistor type printed circuit board 7, the silver terminal electrode layers 2 and 2' acting as terminals of the resistor layers 3 are disposed at the lowermost location on the insulating substrate 1 and the copper wiring conductive layers 4 which restrict occurrence of ion migration are formed on the terminal electrode layers 2 and 2' so as to completely coat the exposed portions of the terminal electrode layers 2 and 2'. Thus, in the thick film resistor type printed circuit board 7, migration of silver ions in less likely to take place than in the prior art thick film resistor type printed circuit board of FIGS. 1a to 1d.

As is clear from the foregoing description, in the thick film resistor type printed circuit board of the present invention, a plurality of the resistor layers are formed on the silver terminal electrode layers formed on the insulating substrate and the exposed portions of the terminal electrode layers are coated with the copper wiring conductive layers which restrict occurrence of ion migration.

Therefore, in accordance with the present invention, migration of silver ions is restricted. Thus, even if the thick film resistor type printed circuit board of the present invention is used under a condition in which silver migration is readily likely to take place, such a possibility associated with the prior art thick film resistor type printed circuit boards is greatly lessened, so that short-circuit of the terminal electrode layers through silver migration is avoided. Accordingly, in accordance with the present invention, a thick film resistor type printed circuit board having high reliability can be obtained.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A thick film resistor type printed circuit board comprising:
    an insulating substrate;
    a plurality of pairs of terminal electrode layers made of silver, which are formed on said insulating substrate;
    a plurality of resistor layers which are formed on said terminal electrode layers so as to connect the pairs of said terminal electrode layers, respectively;
    a plurality of wiring conductive layers made of copper, which are, respectively, connected to predetermined ones of said terminal electrode layers so as to coat said terminal electrode layers; and
    a protective layer for covering at least a portion of said insulating substrate, in which portion said terminal electrode layers and said resistor layers are formed.

2. A thick film resistor type printed circuit board as claimed in claim 1, wherein cuts are formed on said resistor layers.

3. A method of manufacturing a thick film resistor type printed circuit board, comprising the steps of:
    forming on an insulating substrate a plurality of pairs of terminal electrode layers made of silver;
    forming a plurality of resistor layers on said terminal electrode layers such that said resistor layers connect the pairs of said terminal electrode layers, respectively;
    forming a plurality of wiring conductive layers made of copper such that said wiring conductive layers are, respectively, connected to predetermined ones of said terminal electrode layers, with said wiring conductive layers coating said terminal electrode layers; and
    forming a protective layer for covering at least a portion of said insulating substrate, in which portion said terminal electrode layers and said resistor layers are formed.

4. A method as claimed in claim 3, wherein said protective layer is formed by printing and curing coating material of epoxy resin.

5. A method as claimed in claim 4, wherein the coating material is cured by heating at 100° to 300° C.

6. A method as claimed in claim 4, wherein the coating material is cured by irradiating ultraviolet rays at 300 mJ/cm$^2$ or more.

* * * * *